(12) United States Patent
Yoshioka et al.

(10) Patent No.: US 10,320,372 B2
(45) Date of Patent: Jun. 11, 2019

(54) INFORMATION PROCESSING DEVICE, SEMICONDUCTOR DEVICE, AND INFORMATION PROCESSING METHOD

(71) Applicant: KABUSHIKI KAISHA TOSHIBA, Minato-ku (JP)

(72) Inventors: Kentaro Yoshioka, Kawasaki (JP); Akihide Sai, Yokohama (JP); Kohei Onizuka, Shinagawa (JP); Masanori Furuta, Odawara (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 15/914,304

(22) Filed: Mar. 7, 2018

(65) Prior Publication Data

US 2018/0343004 A1 Nov. 29, 2018

(30) Foreign Application Priority Data

May 23, 2017 (JP) ................................. 2017-101952

(51) Int. Cl.
| | |
|---|---|
| *H03K 5/06* | (2006.01) |
| *H03K 3/03* | (2006.01) |
| *H03K 5/08* | (2006.01) |
| *H03K 5/00* | (2006.01) |
| *G06N 20/00* | (2019.01) |

(52) U.S. Cl.
CPC ............ *H03K 5/06* (2013.01); *H03K 3/0315* (2013.01); *H03K 5/08* (2013.01); *G06N 20/00* (2019.01); *H03K 2005/00058* (2013.01); *H03K 2005/00195* (2013.01)

(58) Field of Classification Search
CPC .......... H03K 5/06; H03K 3/0315; H03K 5/08; H03K 2005/00195; H03K 2005/00058
See application file for complete search history.

(56) References Cited

U.S. PATENT DOCUMENTS

| | | | | |
|---|---|---|---|---|
| 5,331,294 A | * | 7/1994 | Watanabe | ............. H03L 7/0996 331/1 A |
| 9,361,577 B2 | | 6/2016 | Miyashita | |

OTHER PUBLICATIONS

Daisuke Miyashita et al., "An LDPC Decoder With Time-Domain Analog and Digital Mixed-Signal Processing," IEEE Journal of Solid State Circuits, vol. 49, No. 1, 2014, pp. 11.
Matthew Z. Straayer et al., "A Multi-Path Gated Ring Oscillator TDC With First-Order Noise Shaping," IEEE Journal of Solid State Circuits, vol. 44, No. 4, 2009, pp. 10.

* cited by examiner

*Primary Examiner* — John W Poos
(74) *Attorney, Agent, or Firm* — Oblon, McClelland, Maier & Neustadt, L.L.P.

(57) ABSTRACT

An information processing device has a digital-to-pulse converter which outputs a pulse signal including a pulse having a pulse length in accordance with a digital input signal, and a selective oscillator which performs an oscillation operation while the pulse of the pulse signal is output and holds an oscillation operation state at a point of time where the output of the pulse is stopped.

18 Claims, 8 Drawing Sheets

INFORMATION PROCESSING DEVICE, SEMICONDUCTOR DEVICE, AND INFORMATION PROCESSING METHOD

CROSS REFERENCE TO RELATED APPLICATIONS

This application is based upon and claims the benefit of priority from the prior Japanese Patent Application No. 2017-101952, filed on May 23, 2017, the entire contents of which are incorporated herein by reference.

FIELD

Embodiments of the present invention relate to an information processing device, a semiconductor device, and an information processing method.

BACKGROUND

Recently, artificial intelligence (AI) has attracted attention. However, it is necessary to perform learning using a large amount of data and operation processing using learning results and an operation processing amount becomes enormous. Therefore, researches are under way to realize at least a part of processing of AI with hardware. In the operation processing of AI, a product-sum operation is performed many times. For this reason, hardware that performs the product-sum operation at a high speed with low power consumption is required.

DETAILED DESCRIPTION

According to one embodiment, an information processing device has a digital-to-pulse converter which outputs a pulse signal including a pulse having a pulse length in accordance with a digital input signal, and a selective oscillator which performs an oscillation operation while the pulse of the pulse signal is output and holds an oscillation operation state at a point of time where the output of the pulse is stopped.

Hereinafter, embodiments will be described with reference to the drawings. In the present specification and the accompanying drawings, some components are omitted, changed, or simplified for ease understanding and illustration. However, this embodiment should be interpreted to include technical contents to the extent that the same functions can be expected.

First Embodiment

Figure 1:
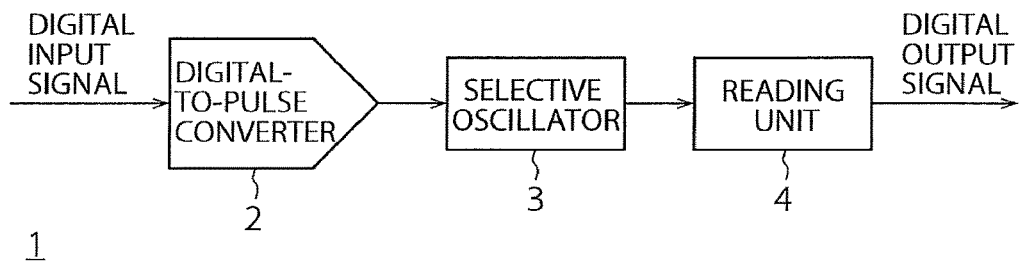
FIG. 1 is a block diagram showing a schematic configuration of an information processing device according to a first embodiment.

FIG. 1 is a block diagram showing a schematic configuration of an information processing device 1 according to a first embodiment. The information processing device 1 of FIG. 1 is an operation circuit that calculates an integration result of N (N is an integer of 2 or more) digital input signals DIN[1:N]. A digital output signal Out to be an output of the information processing device 1 of FIG. 1 is represented by the following formula (1).

$$\text{Out} = \sum_{i=1}^{N} DIN[i] \qquad (1)$$

The information processing device 1 of FIG. 1 includes a digital-to-pulse converter 2, a selective oscillator 3, and a reading unit 4.

The digital-to-pulse converter 2 outputs a pulse signal including a pulse having a pulse length in accordance with a digital input signal. For example, when the digital input signal is 1, the digital-to-pulse converter 2 outputs a pulse signal including a pulse having a pulse length of 1 ns and when the digital input signal is 4, the digital-to-pulse converter 2 outputs a pulse signal including a pulse having a pulse length of 4 ns.

Figure 2:
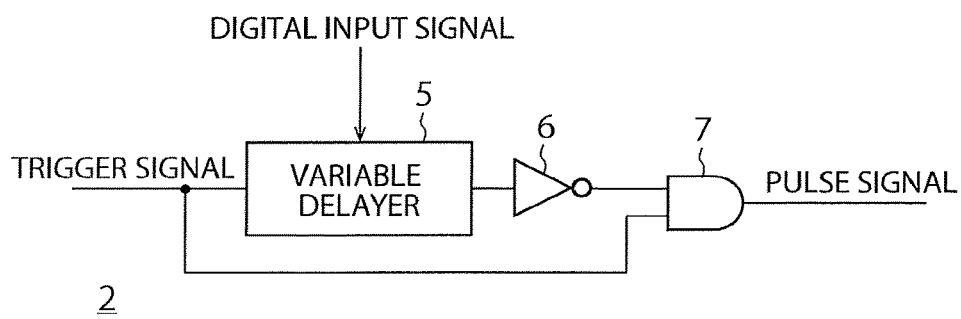
FIG. 2 is a block diagram showing an example of an internal configuration of a digital-to-pulse converter.

FIG. 2 is a block diagram showing an example of an internal configuration of the digital-to-pulse converter 2 and FIG. is an operation timing diagram of the digital-to-pulse converter 2 of FIG. 2. The digital-to-pulse converter 2 of FIG. 2 has a variable delayer 5, an inverter 6, and an AND circuit 7. A trigger signal and a digital input signal are input to the variable delayer 5. The trigger signal is a signal switched from low to high in accordance with operation start timing of the digital-to-pulse converter 2. The variable delayer 5 outputs a delayed trigger signal obtained by delaying the trigger signal by a delay amount in accordance with the digital input signal. The inverter 6 inverts the delayed trigger signal and outputs the delayed trigger signal. The AND circuit 7 outputs an AND signal of an output signal of the inverter 6 and the trigger signal. The output signal of the AND circuit 7 is a pulse signal including a pulse having a pulse length in accordance with the digital input signal.

Figure 3:
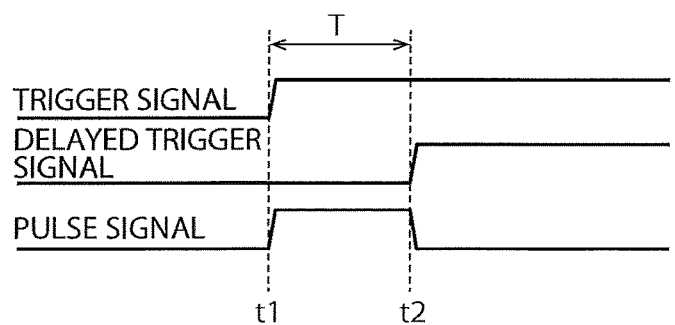
FIG. 3 is an operation timing diagram of the digital-to-pulse converter of FIG. 2.

When the trigger signal changes from low to high at time t1 in FIG. 3, the variable delayer 5 delays the trigger signal by time T in accordance with the digital input signal and outputs a delayed trigger signal that changes from low to high at time t2. The AND circuit 7 outputs a pulse signal that is a logical product of the trigger signal and an inversion signal of the delayed trigger signal. The pulse length of the pulse included in the pulse signal becomes substantially equal to the time T by which the variable delayer 5 delays the trigger signal.

The selective oscillator 3 performs an oscillation operation while the pulse of the pulse signal is output and holds an oscillation operation state at a point of time where the output of the pulse is stopped. For example, the selective oscillator 3 performs an oscillation operation only while an enable signal is high, stops oscillation while the enable signal is low, and stores an oscillation operation state in a state where the enable signal is switched from high to low. Here, the oscillation operation state is, for example, the number of oscillations and the phase state of the oscillation signal.

The reading unit 4 outputs a digital output signal including the oscillation operation state. That is, the reading unit 4 outputs a digital output signal including information of the number of oscillations and the phase state of the oscillation signal of the selective oscillator 3. The reading unit 4 is not an essential component in the information processing device 1 of FIG. 1 and may be omitted in some cases. Alternatively, instead of the reading unit 4, an operation circuit that executes predetermined operation processing using the signal showing the oscillation operation state output from the selective oscillator 3 may be connected to the selective oscillator 3.

Figure 4:
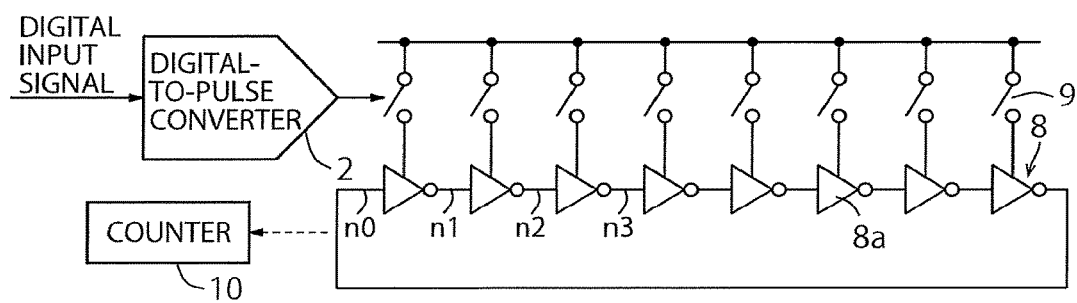
FIG. 4 is a diagram showing a specific example of a selective oscillator.

FIG. 4 is a diagram showing a specific example of the selective oscillator 3. The selective oscillator 3 of FIG. 4 has a ring oscillator 8 and a plurality of switches 9.

The ring oscillator 8 has a plurality of delay elements 8a connected in a ring shape and sequentially transmits an initial pulse signal by the plurality of delay elements 8a. The number of connection stages of the delay elements 8a in the ring oscillator 8 is an odd number. Each delay element 8a is, for example, an inverter.

The plurality of switches 9 switch whether or not to cause the plurality of delay elements 8a to perform a delay operation. Each switch 9 switches whether or not to supply a power supply voltage to the corresponding delay element 8a, for example.

Hereinafter, the case where each switch 9 supplies the power supply voltage to the corresponding delay element 8a is called turned on and the case where each switch 9 does not supply the power supply voltage to the corresponding delay element 8a is called turned off. When the corresponding switch 9 is turned on, each delay element 8a delays an output signal of the delay element 8a at the previous stage and outputs the output signal and when the corresponding switch 9 is turned off, each delay element 8a stops a propagation delay operation of a signal. All the switches 9 are turned on or off in synchronization with each other. In other words, a situation where a part of the switches 9 is turned on and the other switches 9 are turned off does not occur.

Figure 5:
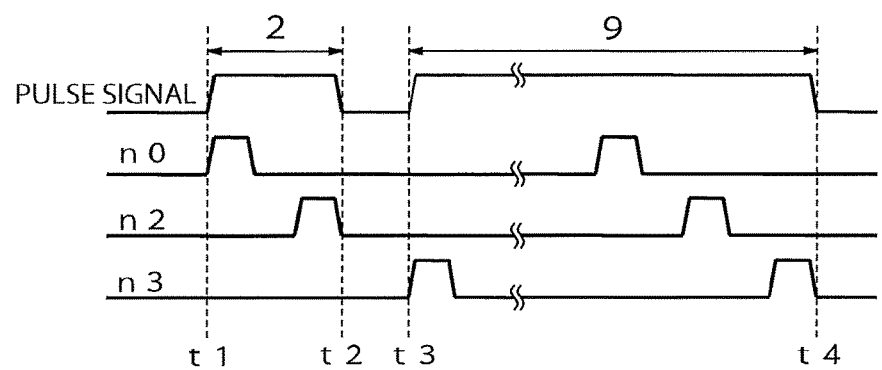
FIG. 5 is a timing diagram of the case where when N=2 digital input signals are sequentially input to the information processing device of FIG. 4.

FIG. 5 is a timing diagram of the case where when N=2 digital input signals are sequentially input to the information processing device 1 of FIG. 4. FIG. 5 shows an example of the case where 2 and 9 are sequentially input as the digital input signals. Here, it is assumed that the selective oscillator 3 is initialized to a desired state, a duty of an oscillation state is ignored, and a phase state is replaced with a pulse for the sake of simplification. The ring oscillator 8 is reset once before the first digital input signal is input and an initial pulse signal having a predetermined pulse length is input to the delay element 8a at the first stage. When the first digital input signal (=2) is input to the digital-to-pulse converter 2 (time t1), the digital-to-pulse converter 2 outputs a pulse signal including a pulse having a pulse length corresponding to the delay amount of the two delay elements 8a. While the pulse having this pulse length is output, all the switches 9 are turned on and the power supply voltage is supplied to all the delay elements 8a. In an initial state, because the initial pulse signal is input to an input terminal of the delay element 8a at the first stage, the initial pulse signal is propagated to an output terminal of the second delay element 8a from the left. When the pulse signal output from the digital-to-pulse converter 2 falls to a low level at time t2, all the switches 9 are turned off and the delay element 8a at the second stage from the left holds a high level to be an immediately previous signal level.

Thereafter, when the second digital input signal (=9) is input (time t3), the digital-to-pulse converter 2 outputs a pulse signal including a pulse having a pulse length corresponding to the delay amount of the nine delay elements 8a. While the pulse having this pulse length is output, all the switches 9 are turned on and the power supply voltage is supplied to all the delay elements 8a. Therefore, the initial pulse signal held by the second delay element 8a from the left is propagated in order by the nine delay elements 8a. Because there are the six delay elements 8a from the second delay element 8a to the rightmost delay element 8a, all the switches 9 are turned off at time t4 when the initial pulse signal propagated from the rightmost delay element 8a to the leftmost delay element 8a is propagated to the third delay element 8a from the left. Therefore, the initial pulse signal is held by the third delay element 8a from the left.

As such, the information processing device 1 of FIG. 1 can execute integration processing of the plurality of digital input signals by using the single selective oscillator 3.

As a result of executing the integration processing of the plurality of digital input signals as in the example shown in FIG. 5, when the initial pulse signal goes around the ring oscillator 8 at least once, it is necessary to store the number of oscillations showing how many times the initial pulse signal has gone around the ring oscillator 8. Therefore, the reading unit 4 of FIG. 4 has a counter 10 that counts up whenever the initial pulse signal goes around the ring oscillator 8. The reading unit 4 detects the number of oscillations by a count value of the counter 10 and detects a phase state indicating which delay element 8a in the ring oscillator 8 holds the initial pulse signal. In addition, the reading unit 4 generates a digital output signal including the number of oscillations and the phase state and outputs the digital output signal.

As such, the information processing device 1 shown in FIG. 4 can execute the integration processing of the plurality of digital input signals continuously unless the counter 10 overflows. As a result, the integration processing of the large number of digital input signals can be executed by only the information processing device 1 of FIG. 4 and a circuit scale required for the integration processing can be reduced.

Figure 6:
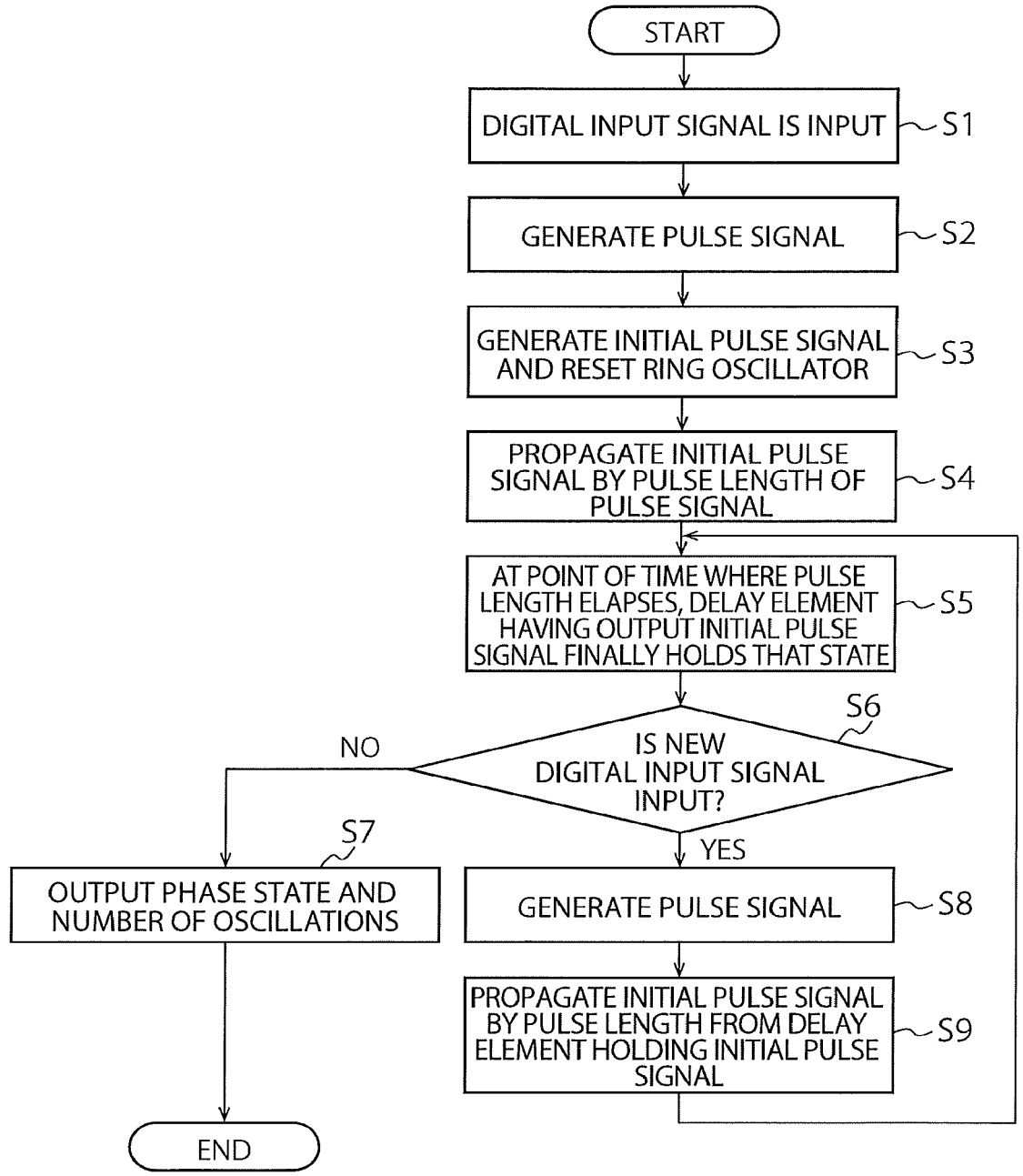
FIG. 6 is a flowchart illustrating a processing algorithm of the information processing device according to this embodiment.

The information processing device 1 according to this embodiment is assumed to be configured by hardware. However, for example, a processor may read and execute a microcode generated in accordance with a predetermined algorithm. FIG. 6 is a flowchart illustrating a processing algorithm of the information processing device 1 according to this embodiment.

When a digital input signal is input to the digital-to-pulse converter 2 (step S1), the digital-to-pulse converter 2 generates a pulse signal including a pulse having a pulse length in accordance with the digital input signal (step S2). The selective oscillator 3 generates an initial pulse signal before and after the processing of steps S1 and S2 and resets the ring oscillator 8 in the selective oscillator 3 (step S3).

When the pulse signal generated in step S2 is input to the selective oscillator 3, the plurality of switches 9 are turned on by a period of the pulse length of the pulse signal and the ring oscillator 8 propagates the initial pulse signal by the pulse length of the pulse signal (step S4). At this time, when the initial pulse signal goes around the ring oscillator 8, the counter 10 is counted up.

When the period of the pulse length of the pulse signal generated in step S2 elapses, the plurality of switches 9 are turned off and the delay element 8a having output the initial pulse signal finally in the ring oscillator 8 holds that state (step S5).

Next, it is determined whether or not a new digital input signal has been input to the digital-to-pulse converter 2 (step S6). When the new digital input signal has not input, the reading unit 4 outputs a digital output signal including a phase state indicating the type of the delay element 8a holding the initial pulse signal and the number of oscillations of the ring oscillator 8 represented by the count value of the counter 10 and ends the processing (step S7).

When the new digital input signal is input to the digital-to-pulse converter 2 in step S6, similar to step S2, a pulse signal including a pulse having a pulse length in accordance with the new digital input signal is generated (step S8). When the pulse signal generated in step S8 is input to the selective oscillator 3, the plurality of switches 9 are turned on by the period of the pulse length of the pulse signal and the ring oscillator 8 propagates the initial pulse signal by the pulse length of the new pulse signal from the delay element 8a holding the initial pulse signal finally (step S9). When the period of the pulse length of the pulse signal generated in step S8 elapses, the processing is executed again from step S5.

As such, in the first embodiment, the pulse signal including the pulse having the pulse length in accordance with the digital input signal is generated by the digital-to-pulse converter 2 and in the selective oscillator 3 to which the pulse signal is input, the oscillation operation is performed while the pulse of the pulse signal is output and the oscillation operation state at a point of time where the output of the pulse is stopped is held. Therefore, it is possible to perform integration and sum operations of a plurality of digital input signals with a simple circuit configuration. In particular, in the first embodiment, the plurality of digital input signals are sequentially input to the digital-to-pulse converter 2, so that integration and sum operations are performed using the same selective oscillator 3. Therefore, even if the number of digital input signals to be operated increases, the configuration of the information processing device 1 does not become complicated, so that integration and sum operations of a large number of digital input signals can be performed by the information processing device 1 having the simple circuit configuration.

Second Embodiment

In a second embodiment, a product-sum operation is performed.

Figure 7:
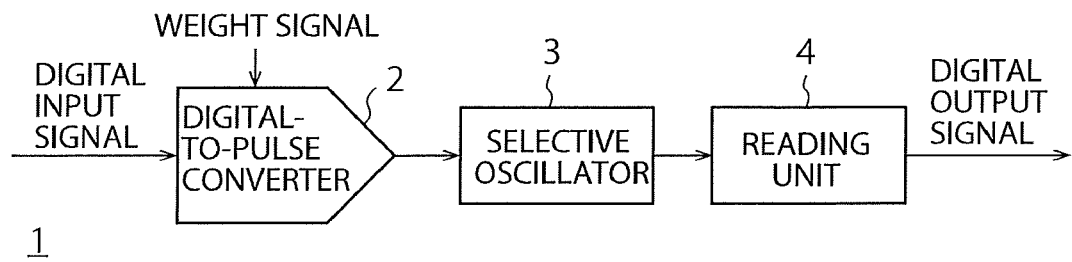
FIG. 7 is a block diagram showing a schematic configuration of an information processing device according to a second embodiment.

FIG. 7 is a block diagram showing a schematic configuration of an information processing device 1 according to a second embodiment. The information processing device 1 of FIG. 7 is different from the information processing device 1 of FIG. 1 in a processing operation of a digital-to-pulse converter 2. A weight signal in accordance with a digital input signal is input to the digital-to-pulse converter 2 of FIG. 7. When an input signal matrix is represented by DIN[1:N] and the weight signal is represented by W[1:N], a digital output signal Out to be an output of the information processing device 1 of FIG. 7 is represented by the following formula (2).

$$\text{Out} = \sum_{i=1}^{N} DIN[i] \times W[i] \quad (2)$$

As a method of performing an operation of the formula (2), weighting of each digital input signal is performed by the digital-to-pulse converter 2 in the information processing device 1 of FIG. 7.

The digital-to-pulse converter 2 of FIG. 7 is represented by the same block configuration as that in FIG. 2. However, the digital-to-pulse converter 2 is characterized by an internal configuration of a variable delayer 5.

Figure 8:
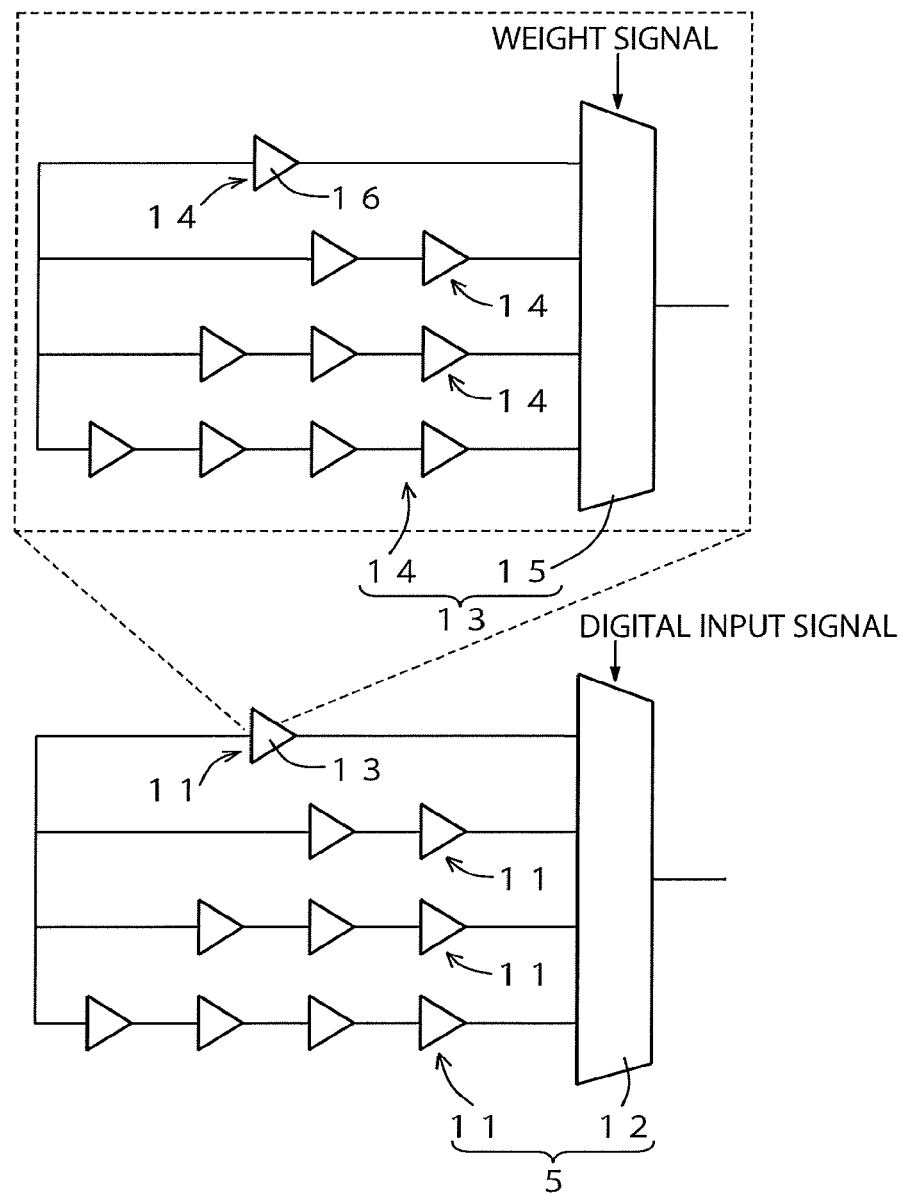
FIG. 8 is a block diagram showing an example of an internal configuration of a variable delayer according to the second embodiment.

FIG. 8 is a block diagram showing an example of the internal configuration of the variable delayer 5 according to the second embodiment.

As shown in a lower part of FIG. 8, the variable delayer 5 has four first delay circuits 11 and a four-input first multiplexer 12. In the four first delay circuits 11, the number of connection stages of variable delay elements 13 is different and a delay amount is different in accordance with the number of connection stages of the variable delay elements 13. The first multiplexer 12 selects one of output signals of the four first delay circuits 11, on the basis of the digital input signal.

As shown in an upper part of FIG. 8, each variable delay element 13 has four second delay circuits 14 and a four-input second multiplexer 15. In the four second delay circuits 14, the number of connection stages of delay elements 16 is different and one of output signals of the four second delay circuits 14 is selected on the basis of a weight signal corresponding to the digital input signal.

In the variable delayer 5 of FIG. 8, both the digital input signal and the weight signal are represented by 2 bits. When the digital input signal is represented by 2 bits, a delay amount of any one of four types of digital input signals is selected by the first multiplexer 12 in the lower part of FIG. 8, because there are the four types of digital input signals. In addition, when the weight signal is represented by 2 bits, a delay amount of any one of four types of weight signals is selected by the second multiplexer 15 in the upper part of FIG. 8, because there are the four types of weight signals. As a result, the variable delayer 5 not only changes the delay amount in accordance with the digital input signal but also changes the delay amount in accordance with the weight signal.

The number of bits of the digital input signal and the weight signal is not necessarily limited to 2 bits. The circuit configuration of the variable delayer 5 of FIG. 8 may be changed in accordance with the number of bits of the digital input signal and the weight signal.

The pulse signal converted by the digital-to-pulse converter 2 of FIG. 8 is input to a selective oscillator 3 of FIG. 7. Similar to the first embodiment, the selective oscillator 3 performs an oscillation operation by a period of a pulse length of the pulse signal and holds an oscillation operation state at a point of time where a pulse output period elapses. As a result, the selective oscillator 3 can perform integration and sum operations on an operation result integrated by the digital-to-pulse converter 2.

As such, in the second embodiment, because the digital input signal is weighted by the weight signal corresponding to the digital input signal, a product-sum operation can be performed by the digital-to-pulse converter 2. In addition, because weighting of the digital input signal is performed by the plurality of delay circuits and the multiplexer, it is not necessary to provide a multiplication circuit having a complicated configuration.

Third Embodiment

In the second embodiment, because a digital input signal and a weight signal are integrated by a digital-to-pulse converter 2, a pulse length of a pulse signal input to a selective oscillator 3 increases when the weight signal is large. As a result, the number of oscillations of the selective oscillator 3 increases and it takes time to execute operation processing. A third embodiment described below solves this problem.

Figure 9:
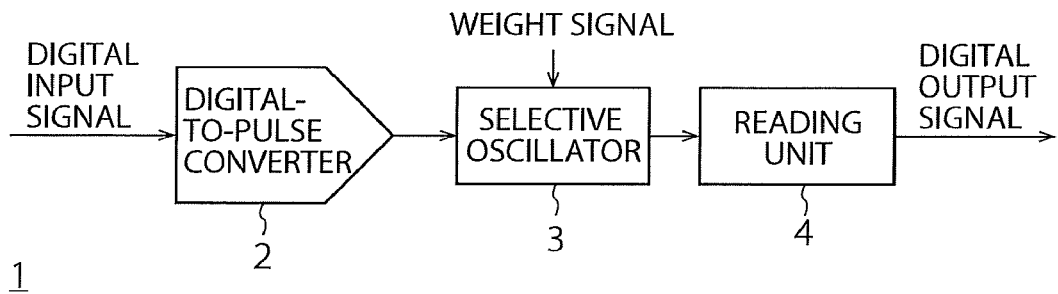
FIG. 9 is a block diagram showing a schematic configuration of an information processing device according to a third embodiment.

FIG. 9 is a block diagram showing a schematic configuration of an information processing device 1 according to the third embodiment. The information processing device 1 of FIG. 9 is different from the information processing device 1 of FIG. 1 or 7 in a configuration of the selective oscillator 3. In addition to a pulse signal output from a digital-to-pulse converter 2, a weight signal is input to the selective oscillator 3 of FIG. 9. The selective oscillator 3 of FIG. 9 controls an oscillation frequency of a ring oscillator 8 by the weight signal, thereby performing a product-sum operation.

Figure 10:
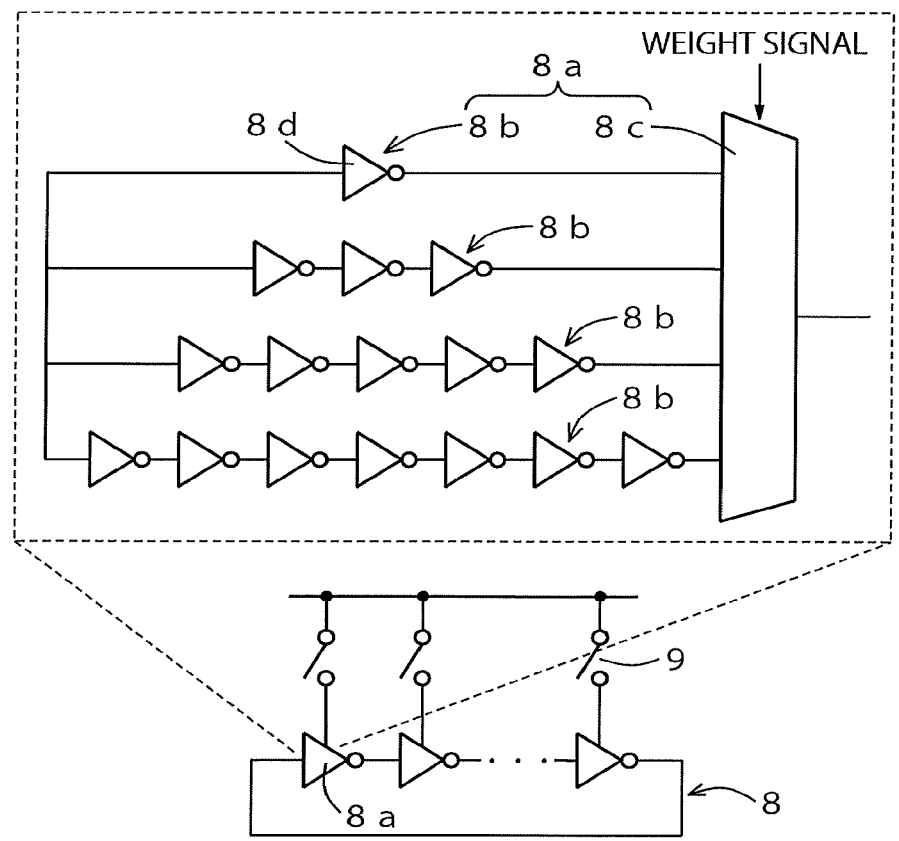
FIG. 10 is a block diagram showing an example of an internal configuration of each delay element configuring an ring oscillator of FIG. 9.

FIG. 10 is a block diagram showing an example of an internal configuration of each delay element 8a configuring the ring oscillator 8 in the selective oscillator 3 of FIG. 9. The delay element 8a of FIG. 10 has four third delay circuits 8b and a four-input third multiplexer 8c. In the four third delay circuits 8b, the number of connection stages of unit delay elements 8d is different and a delay amount is different in accordance with the number of connection stages of the unit delay elements 8d. The third multiplexer 8c selects one of output signals of the four third delay circuits 8b, on the basis of a weight signal in accordance with the digital input signal.

As shown in FIG. 2, the ring oscillator 8 is obtained by connecting the plurality of delay elements 8a in a ring shape and each delay element 8a is configured by one or more unit delay elements 8d as shown in FIG. 10. If the delay amount of each unit delay element 8d is tiny and the number of unit delay elements 8d corresponding to all the delay elements 8a configuring the ring oscillator 8 is N, an oscillation frequency of the ring oscillator 8 is represented by the following formula (3).

$$freq = \frac{1}{N \times tinv} \quad (3)$$

As seen from the formula (3), the oscillation frequency is changed by the number N of all the unit delay elements 8d in the ring oscillator 8 and the delay amount tiny of each unit delay element 8d. For example, when the digital input signal DIN is 9, the number of oscillations in N=3 is 3, the number of oscillations in N=5 is 9/5=1.8, and integration in accordance with the number of connection stages of the unit delay elements 8d is performed. For example, when the weight signal is large, a value of N is decreased, so that the oscillation frequency of the ring oscillator 8 becomes high, and the product-sum operation can be performed more quickly.

As such, in the third embodiment, the oscillation frequency of the ring oscillator 8 is variably controlled in accordance with the weight signal. Therefore, even if the weight signal increases, it does not take time to perform the product-sum operation in the selective oscillator 3. As a method of changing the oscillation frequency of the ring oscillator 8, not only a method of changing the number of stages but also a general method of a digitally controlled oscillator (DCO) can be used. For example, to change the oscillation frequency, a variable capacity load controlled by a digital signal is added to each inverter output, so that the delay amount tiny of the formula (3) is changed, and the oscillation frequency can be controlled. In addition, a driving current is controlled by using a current driving type inverter, so that the delay amount tiny is changed, and the oscillation frequency freq can be controlled.

Fourth Embodiment

In a fourth embodiment described below, a product-sum operation is performed on output signals of reading units 4.

Figure 11:
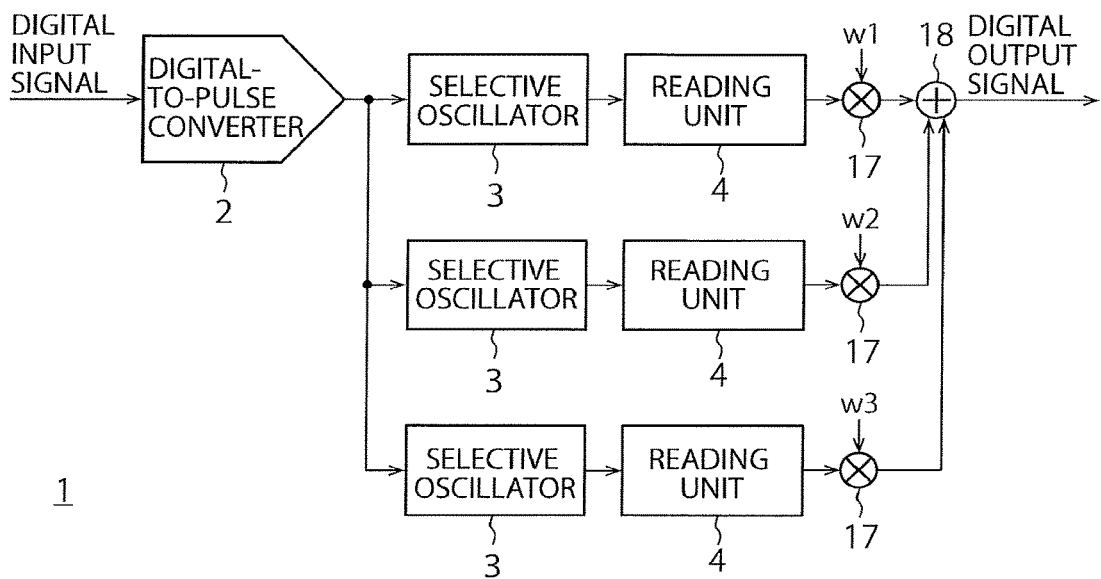
FIG. 11 is a block diagram showing a schematic configuration of an information processing device according to a fourth embodiment.

FIG. 11 is a block diagram showing a schematic configuration of an information processing device 1 according to the fourth embodiment. The information processing device 1 of FIG. 11 includes a plurality of sets of selective oscillators 3 and reading units 4. Each set of selective oscillator 3 and reading unit 4 corresponds to a different weight signal of a digital input signal. FIG. 11 shows an example of the case where three sets of selective oscillators 3 and reading units 4 are provided in association with three types of weight signals w1 to w3. The types of weight signals are not limited to the three types. For example, when there are n types of weight signals, n sets of selective oscillators 3 and reading units 4 may be provided.

A pulse signal of a corresponding weight signal is input to each set of selective oscillator 3. Each set of selective oscillator 3 performs an oscillation operation by a period of a pulse length of the input pulse signal. Each set of reading unit outputs a digital output signal including an oscillation operation state of the corresponding selective oscillator 3.

A corresponding multiplier (weighting unit) 17 is connected to each set of reading unit 4. Each set of multiplier 17 executes processing for multiplying a corresponding digital output signal by a corresponding weight signal. Multiplication results of the individual multipliers 17 are added by an adder (synthesizer) 18 and a final product-sum operation result is obtained.

As such, in the fourth embodiment, because the product-sum operation processing is executed at the subsequent stage side of the reading unit 4, operation processing time of the selective oscillator 3 is not changed by the weight signal. In addition, the internal configuration of the selective oscillator 3 can be simplified as compared with the third embodiment.

Fifth Embodiment

In a fifth embodiment, a digital input signal input to a digital-to-pulse converter 2 is weighted.

Figure 12:
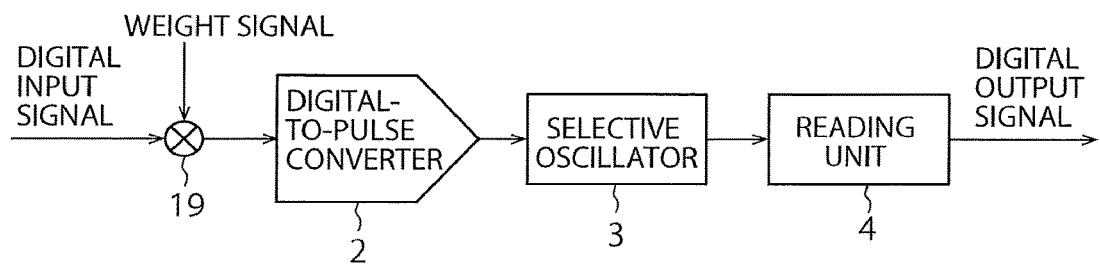
FIG. 12 is a block diagram showing a schematic configuration of an information processing device according to a fifth embodiment.

FIG. 12 is a block diagram showing a schematic configuration of an information processing device 1 according to the fifth embodiment. The information processing device 1 of FIG. 12 includes a multiplier (weighting unit) 19 in addition to the configuration of FIG. 1. The multiplier 19 executes processing for multiplying a digital input signal by a weight signal. The digital input signal weighted by the multiplier 19 is input to the digital-to-pulse converter 2. Processing operations of the digital-to-pulse converter 2, a selective oscillator 3, and a reading unit 4 are the same as those in the information processing device 1 of FIG. 1. However, because the digital input signal input to the digital-to-pulse converter 2 is already weighted, the information processing device 1 of FIG. 12 can perform a product-sum operation.

As such, because weighting processing of the digital input signal is executed at the previous stage side of the digital-to-pulse converter 2, the product-sum operation can be performed even if a configuration at stages after the digital-to-pulse converter 2 is equalized to that in FIG. 1.

At least two or more weighting processing among the weighting processing of FIGS. 7 to 12 described above may be combined and executed. For example, the weighting processing in the digital-to-pulse converter 2 in FIG. 7 and the weighting processing in the selective oscillator 3 in FIG. 9 may be performed. As a result, it is possible to execute more complex product-sum operation processing.

Sixth Embodiment

In the first to fifth embodiments described above, integration processing of a digital input signal not having a sign has been described. However, when the digital input signal has the sign, after integration processing is executed for each sign, a difference thereof may be operated.

Figure 13:
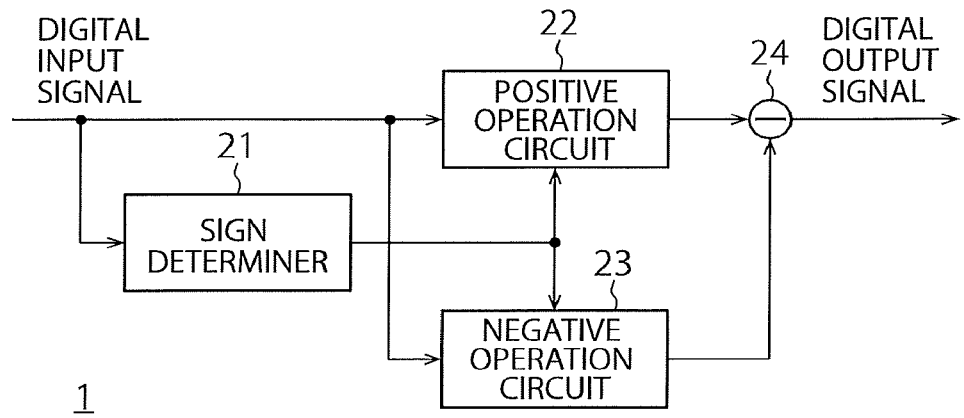
FIG. 13 is a block diagram showing a schematic configuration of an information processing device according to a sixth embodiment.

FIG. 13 is a block diagram showing a schematic configuration of an information processing device 1 according to the sixth embodiment. The information processing device 1 of FIG. 13 includes a sign determiner 21, a positive operation circuit (first operation circuit) 22, a negative operation circuit (second operation circuit) 23, and a subtracter 24. The sign determiner 21 determines the sign of the digital input signal. When there is a possibility that a weight signal takes a negative value, both the digital input signal and the weight signal are input to the sign determiner 21 and the sign is determined by the sign determiner 21 in consideration of both the digital input signal and the weight signal.

Both the positive operation circuit 22 and the negative operation circuit 23 have the same circuit configuration. For example, each of the positive operation circuit 22 and the negative operation circuit 23 has a digital-to-pulse converter 2, a selective oscillator 3, and a reading unit 4 of FIG. 7. When it is determined by the sign determiner 21 that the digital input signal is positive, the positive operation circuit 22 performs product-sum operation processing using the digital input signal. When it is determined by the sign determiner 21 that the digital input signal is negative, the negative operation circuit 23 performs the product-sum operation processing using the digital input signal.

As such, in the information processing device 1 of FIG. 13, the positive operation circuit 22 performs the product-sum operation processing on the positive digital input signal and the negative operation circuit 23 performs the product-sum operation processing on the negative digital input signal.

The subtracter 24 outputs a signal obtained by subtracting the output signal of the negative operation circuit 23 from the output signal of the positive operation circuit 22. By the output of the subtracter 24, a product-sum operation result taking the sign into consideration is obtained.

As such, in the sixth embodiment, the product-sum operation on the positive digital input signal and the product-sum operation on the negative digital input signal are performed individually and then the difference thereof is taken, so that the product-sum operation taking the sign into consideration can be performed. As a result, the positive operation circuit 22 and the negative operation circuit 23 can be configured to have a common circuit configuration.

Seventh Embodiment

A digital input signal and a weight signal are binary values, but may be represented as values changing with the power of 2 as a unit. For example, digital input signals 000=0, 001=1, 010=2, 011=4, and 100=8 may be used. If a value represented by the power of 2 is expressed in the logarithm log 2, the value becomes a value increasing by 1, handling is convenient, and a design of a variable delayer 5 can be simplified.

On the other hand, the digital input signal and the weight signal may be values that change by the same value. As a result, an interval of the values of the respective signals can be kept constant and a more accurate operation can be performed.

Eighth Embodiment

By arranging a plurality of information processing devices 1 described in the first to seventh embodiments described above and operating the information processing devices 1 in parallel, a product-sum operation core having a parallel product-sum operation function with high operation capability can be constructed.

Figure 14:
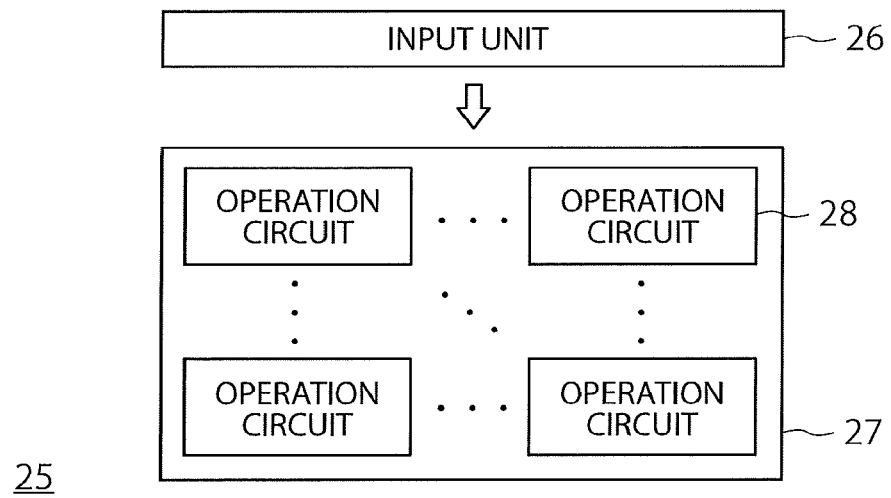
FIG. 14 is a block diagram showing an example of an internal configuration of a product-sum operation core that has a plurality of information processing devices described in the first to seventh embodiments and can operate in parallel.

FIG. 14 is a block diagram showing an example of an internal configuration of a product-sum operation core 25 that has the plurality of information processing devices 1 described in the first to seventh embodiments and can operate in parallel. The product-sum operation core 25 of FIG. 14 can be mounted on a semiconductor substrate or a printed circuit board, for example, and includes an input unit 26 and an operation processing unit 27. A plurality of operation circuits 28 having the same functions as those of the information processing devices 1 described in the first to seventh embodiments are arranged in the operation processing unit 27. Each operation circuit 28 can execute operation processing in parallel or sequentially as necessary.

Figure 15:
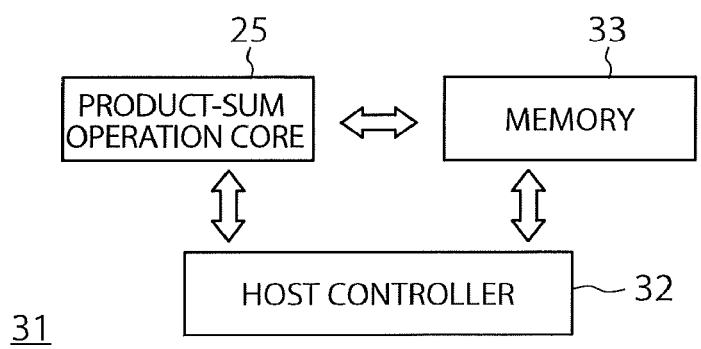
FIG. 15 is a block diagram showing an example of a schematic configuration of a signal processing device including the product-sum operation core shown in FIG. 14.

FIG. 15 is a block diagram showing an example of a schematic configuration of a signal processing device 31 including the product-sum operation core 25 shown in FIG. 14. The signal processing device 31 of FIG. 15 includes the product-sum operation core 25 shown in FIG. 14, a host controller 32, and a memory 33. The memory 33 has at least one of a nonvolatile memory and a volatile memory. In addition, the memory 33 may be hierarchically divided like a cache memory and a main memory. The signal processing device 31 of FIG. 15 may be formed on a semiconductor substrate to become a chip or may be mounted on a printed circuit board.

Figure 16:
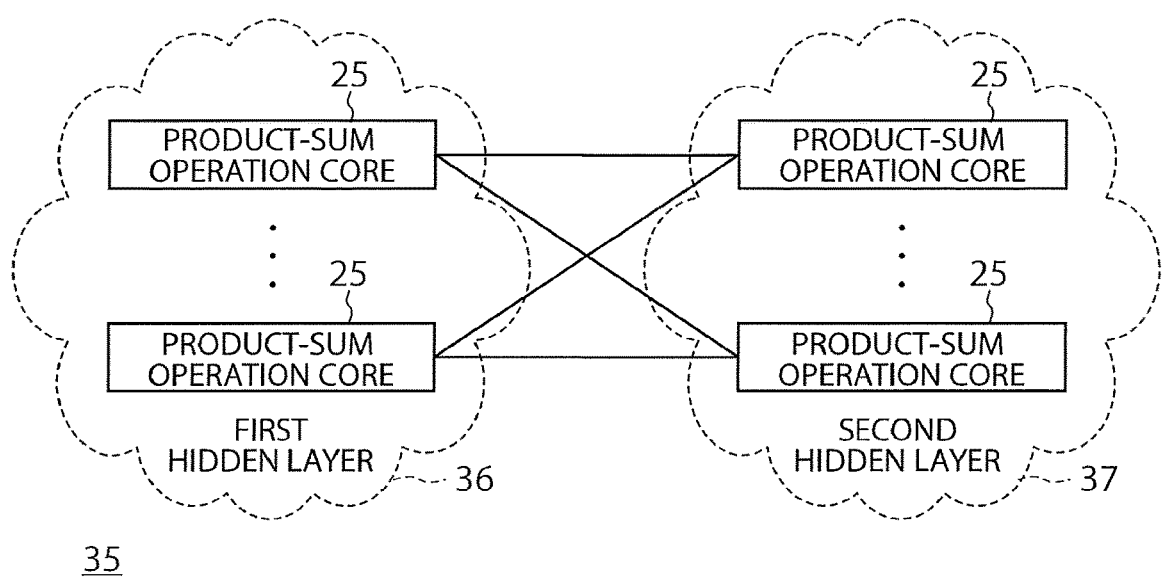
FIG. 16 is a block diagram showing an example of a brain-type neural network system.

A brain-type neural network system may be constructed by using the product-sum operation core 25 shown in FIG. 14 or 15. FIG. 16 is a block diagram showing an example of a brain-type neural network system 35. The neural network system 35 of FIG. 16 has a hierarchical structure and a plurality of product-sum operation cores 25 in a first hidden layer 36 and a plurality of product-sum operation cores 25 in a second hidden layer 37 perform various product-sum operations. In addition, output signals of the plurality of product-sum operation cores 25 in the first hidden layer 36 are weighted as necessary and are then input to the plurality of product-sum operation cores 25 in the second hidden layer 37.

As such, in the eighth embodiment, the plurality of information processing devices 1 described in the first to seventh embodiments are provided, so that product-sum operations in various applications can be performed.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. An information processing device comprising:
    a digital-to-pulse converter which outputs N (N is an integer of 2 or more) pulse signals including pulses having pulse lengths in accordance with N digital input signals sequentially input; and
    a selective oscillator which:
        performs a first oscillation operation according to pulse lengths of a first pulse signal of the N pulse signals when the first pulse signal is input,
        holds an oscillation operation state after the first oscillation operation,
        performs a second oscillation operation from the held oscillation operation state when a second pulse signal is input, and
        holds a second oscillation operation state after the second oscillation operation.

2. The information processing device according to claim 1, further comprising:
    a reading unit which outputs a digital output signal including the first oscillation operation state and the second oscillation operation state.

3. The information processing device according to claim 2, wherein
    a plurality of sets each of which comprises the selective oscillator and the reading unit and which are different for each of weight signals of the N digital input signals are provided, and
    the digital-to-pulse converter inputs the N digital input signals to the selective oscillator of the set in accordance with the corresponding weight signals.

4. The information processing device according to claim 3, further comprising:
    a plurality of weighting units which weight a plurality of digital output signals output from a plurality of reading units in the plurality of sets, in accordance with corresponding weight signals; and
    a synthesis unit which synthesizes output signals of the plurality of weighting units.

5. The information processing device according to claim 2, wherein
    the selective oscillator comprises:
        a ring oscillator which comprises a plurality of delay elements connected in a ring shape and sequentially transmits an initial pulse signal by the plurality of delay elements; and
        a plurality of switches which switch whether or not to cause the plurality of delay elements to perform a delay operation, and
    the reading unit holds the number of oscillations by the ring oscillator and a phase state specified by the delay element holding the initial pulse signal at a point of time where the output of the pulse is stopped as the first oscillation operation state.

6. The information processing device according to claim 1, wherein
    the digital-to-pulse converter outputs the N pulse signals including pulses having pulse lengths in accordance with the N digital input signals and a corresponding weight signal of the digital input signal.

7. The information processing device according to claim 1, further comprising:
    a weighting unit which generates N weighted digital input signals obtained by weighting the N digital input signals by a corresponding weight signals of the N digital input signals and inputs the N weighted digital input signals to the digital-to-pulse converter.

8. The information processing device according to claim 5, wherein
    the plurality of delay elements in the ring oscillator have delay times in accordance with a corresponding weight signals of the N digital input signals.

9. The information processing device according to claim 1, further comprising:
    a sign determiner which determines whether positive operation processing is executed or negative operation processing is executed, on the basis of the N digital input signals and a corresponding weight signals of the N digital input signals;
    a first operation circuit which, when it is determined by the sign determiner that the positive operation processing is executed, executes the positive operation processing on the basis of the N digital input signals and the corresponding weight signals;
    a second operation circuit which, when it is determined by the sign determiner that the negative operation processing is executed, executes the negative operation processing on the basis of the N digital input signals and the corresponding weight signals; and
    a subtracter which subtracts an output signal of the second operation circuit from an output signal of the first operation circuit, wherein
    each of the first operation circuit and the second operation circuit comprises the selective oscillator.

10. A semiconductor device comprising:
    a product-sum operation core in which a plurality of operation circuits each having an information processing device are disposed on the same semiconductor substrate, wherein
    the information processing device comprises:
        a digital-to-pulse converter which outputs N (N is an integer of 2 or more) pulse signals including pulses having pulse lengths in accordance with N digital input signals sequentially input; and a selective oscillator which:
performs a first oscillation operation according to pulse lengths of a first pulse signal of the N pulse signals when the first pulse signal is input, holds an oscillation operation state after the first oscillation operation, performs a second oscillation operation from the held oscillation operation state when a second pulse signal is input, and holds a second oscillation operation state after the second oscillation operation.

11. An information processing method comprising:
outputting N (N is an integer of 2 or more) pulse signals including pulses having pulse lengths in accordance with N digital input signals sequentially input from a digital-to-pulse converter;

performing a first oscillation operation according to pulse lengths of a first pulse signal of the N pulse signals when the first pulse signal is input;

holding an oscillation operation state after the first oscillation operation;

performing a second oscillation operation from the held oscillation operation state when a second pulse signal is input; and holding a second oscillation operation state after the second oscillation operation.

12. The information processing method according to claim 11, further comprising:
outputting a digital output signal including the first oscillation operation state and the second oscillation operation state.

13. The information processing method according to claim 12, wherein
a plurality of sets each of which comprises the selective oscillator and the reading unit and which are different for each of weight signals of the N digital input signals are provided, and the digital-to-pulse converter inputs the N digital input signals to the selective oscillator of the set in accordance with the corresponding weight signals.

14. The information processing method according to claim 13, further comprising:
weighting a plurality of digital output signals output from a plurality of reading units in the plurality of sets, in accordance with corresponding weight signals; and synthesizing the weighted output signals of the plurality of weighting units.

15. The information processing method according to claim 12, wherein
performing the oscillating operations by a selective oscillator by using a ring oscillator which comprises a plurality of delay elements connected in a ring shape, sequentially transmitting an initial pulse signal by the plurality of delay elements; and switching whether or not to cause the plurality of delay elements to perform a delay operation, and the outputting the digital output signal holds the number of oscillations by the ring oscillator and a phase state specified by the delay element holding the initial pulse signal at a point of time where the output of the pulse is stopped as the first oscillation operation state.

16. The information processing method according to claim 11, wherein
the digital-to-pulse converter outputs the N pulse signals including pulses having pulse lengths in accordance with the N digital input signals and a corresponding weight signal of the digital input signal.

17. The information processing method according to claim 11, further comprising:
generating N weighted digital input signals obtained by weighting the N digital input signals by a corresponding weight signals of the N digital input signals and inputs the N weighted digital input signal to the digital-to-pulse converter.

18. The information processing method according to claim 15, wherein
the plurality of delay elements in the ring oscillator have delay time in accordance with a corresponding weight signals of the N digital input signals.

* * * * *